United States Patent
Homeijer et al.

(10) Patent No.: US 10,139,564 B1
(45) Date of Patent: Nov. 27, 2018

(54) VERTICALLY INTEGRATED OPTOELECTRONICS PACKAGE FOR MEMS DEVICES

(71) Applicant: National Technology & Engineering Solutions of Sandia, LLC, Albuquerque, NM (US)

(72) Inventors: Brian D. Homeijer, Albuquerque, NM (US); Matt Eichenfield, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 478 days.

(21) Appl. No.: 15/009,153

(22) Filed: Jan. 28, 2016

Related U.S. Application Data

(60) Provisional application No. 62/108,724, filed on Jan. 28, 2015.

(51) Int. Cl.
| | |
|---|---|
| *G02B 6/122* | (2006.01) |
| *G02B 6/34* | (2006.01) |
| *H01S 5/42* | (2006.01) |
| *H01S 5/343* | (2006.01) |
| *G02B 6/42* | (2006.01) |
| *H01S 5/022* | (2006.01) |

(52) U.S. Cl.
CPC ............ *G02B 6/1225* (2013.01); *G02B 6/34* (2013.01); *G02B 6/4232* (2013.01); *H01S 5/02248* (2013.01); *H01S 5/02268* (2013.01); *H01S 5/02272* (2013.01); *H01S 5/343* (2013.01); *H01S 5/426* (2013.01)

(58) Field of Classification Search
CPC ...... G02B 6/1225; G02B 6/34; G02B 6/4232; H01S 5/02248; H01S 5/02268; H01S 5/02272; H01S 5/343; H01S 5/426
See application file for complete search history.

(56) References Cited

U.S. PATENT DOCUMENTS

| | | | |
|---|---|---|---|
| 5,493,577 | A | 2/1996 | Choquette et al. |
| 5,568,499 | A | 10/1996 | Lear |
| 7,066,004 | B1 | 6/2006 | Kohler et al. |
| 7,106,448 | B1 | 9/2006 | Vawter et al. |
| 7,148,436 | B1 | 12/2006 | Lee et al. |
| 7,212,944 | B1 | 5/2007 | Kohler et al. |

(Continued)

FOREIGN PATENT DOCUMENTS

| | | |
|---|---|---|
| WO | WO 2013/131067 A1 | 9/2013 |

OTHER PUBLICATIONS

U.S. Appl. No. 15/009,171, filed Jan. 28, 2016, Eichenfield et al.
(Continued)

*Primary Examiner* — Georgia Y Epps
*Assistant Examiner* — Don Williams
(74) *Attorney, Agent, or Firm* — Helen S. Baca; Mark A. Dodd

(57) ABSTRACT

The present application relates to vertically integrated assemblies including a MEMS-based optomechanical architecture. In some embodiments, the assembly includes a MEMS/optoelectronic module, an emitter module, and a detector module, where these modules are vertically integrated. Methods of fabricating such assemblies are also described herein.

20 Claims, 6 Drawing Sheets

(56) References Cited

U.S. PATENT DOCUMENTS

| | | | |
|---|---|---|---|
| 7,213,458 | B2 | 5/2007 | Weber et al. |
| 7,275,433 | B2 | 10/2007 | Caminada et al. |
| 7,355,720 | B1 | 4/2008 | Carr |
| 7,484,411 | B2 | 2/2009 | Walmsley |
| 8,087,295 | B2 | 1/2012 | Netzer |
| 8,205,497 | B1 | 6/2012 | Okandan et al. |
| 8,228,964 | B2 | 7/2012 | Sekiguchi |
| 8,272,266 | B2 | 9/2012 | Zhang et al. |
| 8,342,025 | B2 | 1/2013 | Coronato et al. |
| 8,459,110 | B2 | 6/2013 | Cazzaniga et al. |
| 8,680,810 | B1 | 3/2014 | Okandan et al. |
| 8,726,730 | B1 | 5/2014 | Nielson et al. |
| 8,776,337 | B2 | 7/2014 | Homeijer et al. |
| 8,783,106 | B1 | 7/2014 | Nielson et al. |
| 9,020,006 | B2 * | 4/2015 | Tan .......... H01S 5/068 372/50.124 |
| 2011/0097031 | A1 * | 4/2011 | Carralero .......... G01D 5/268 385/12 |
| 2013/0121633 | A1 | 5/2013 | Painter et al. |

OTHER PUBLICATIONS

Augustin M et al., "Dispersion properties of photonic crystal waveguides with a low in-plane index contrast," *New J. Phys.* 2006;8:210 (14 pp.).

Blasius T et al., "Chip-scale cavity-optomechanical accelerometer," *Conf. on Lasers and Electro-Optics (CLEO): Science and Innovation*, held on Jun. 9-14, 2013 in San Jose, CA, abstract CW3F.1 (2 pp.).

Chan J et al., "Optical and mechanical design of a 'zipper' photonic crystal optomechanical cavity," *Opt. Express* Mar. 2009;17(5):3802-17.

Chow E et al., "Three-dimensional control of light in a two-dimensional photonic crystal slab," *Nature* 2000;407:983-6.

Chow EKC et al., "Demonstration of high waveguide bending efficiency (>90%) in a photonic-crystal slab at 1.5μm wavelengths," *Proc. SPIE* 2001;4283:453-61.

Davanço M et al., "Slot-mode-coupled optomechanical crystals," *Opt. Express* 2012;20(22):24394-410.

Eichenfield M et al., "A picogram- and nanometre-scale photonic-crystal optomechanical cavity," *Nature* May 2009;459:550-5.

Eichenfield M et al., "Optomechanical crystals," *Nature* Nov. 2009;462:78-82.

Eichenfield M, "Cavity optomechanics in photonic and phononic crystals: Engineering the interaction of light and sound at the nanoscale," Ph.D. Thesis for the Division of Physics, Mathematics and Astronomy at the California Institute of Technology, 2010 (182 pp.).

Guo ZY et al., "A lateral-axis micromachined tuning fork gyroscope with torsional Z-sensing and electrostatic force-balanced driving," *J. Micromech. Microeng.* 2010;20:025007 (7 pp.).

Homeijer B et al., "Hewlett Packard's seismic grade MEMS accelerometer," *IEEE 24th Int'l Conf on Micro Electro Mechanical Systems (MEMS)*, held on Jan. 23-27, 2011 in Cancun, Mexico, pp. 585-588.

Homeijer BD et al., "A brief test of the Hewlett-Packard MEMS seismic accelerometer," U.S. Geological Survey Open-File Report 2014-1047, 22 pp., available pubs.usgs.gov/of/2014/1047/pdf/ofr2014-1047.pdf).

Honeywell International Inc., "Honeywell tactical inertial measurement units (IMU): Comprehensive solutions for inertial positioning information," Doc. No. N61-0628-000-000, 2007, 4 pp.

Jones AM et al., "Ultra-low crosstalk, CMOS compatible waveguide crossings for densely integrated photonic interconnection networks," *Opt. Express* 2013;21(10):12002-13.

Keese B et al., "Characterization and production control for DRIE of MEMS accelerometers using optical displacement transducer measurements," *Solid State Sensors, Actuators and Microsystems Workshop*, held on Jun. 3-7, 2012 at Hilton Head, SC.

Khankhua S et al., "Design and simulation of MEMS based tuning fork micro-gyroscope," *Appl. Mech. Mater.* 2012;110-116:5036-43.

Krause AG et al., "A high-resolution microchip optomechanical accelerometer," *Nat. Photon.* 2012;6:768-72.

Krishnan G et al., "Micromachined high-resolution accelerometers," *J. Indian Instit. Sci.* Jul.-Sep. 2007;87(3):333-61.

Laughlin D et al., "A Multi-Sensor Azimuth Measurement Device," Presented at the 2012 Joint Precision Azimuth Sensor Conference (JPASS), Richmond, VA, Feb. 27, Mar. 1, 2012.

Laughlin DR et al., "ARS-12G inertial angular vibration sensor provides nanoradian measurement," *Proc. SPIE* Aug. 2001;4365:168-75.

Lemkin MA et al., "A 3-axis force balanced accelerometer using a single proof-mass," *Int'l Conf on Solid State Sensors and Actuators*, held on Jun. 16-19, 1997 in Chicago, IL, vol. 2, pp. 1185-1188.

Lin Q et al., "Coherent mixing of mechanical excitations in nano-optomechanical structures," *Nat. Photonics* Apr. 2010;4:236-42.

Lutwak R et al., "The chip-scale atomic clock—low-power physics package," *Annual Precise Time and Time Interval Meeting*, held on Dec. 7-9, 2004, in Washington, DC, pp. 339-354.

Milligan DJ et al., "An ultra-low noise MEMS accelerometer for seismic imaging," *Proc. IEEE Sensors*, held on Oct. 28-31, 2011, in Limerick, Ireland, pp. 1281-1284.

Northrop Grumman Sys. Corp., "LN-200 FOG family: Advanced airborne IMU/AHRS," Doc. No. DS-476-JYC-0313, ePROCS No. 13-0454, 2013, 2 pp.

Safavi-Naeini AH et al., "Electromagnetically induced transparency and slow light with optomechanics," *Nature* Apr. 2011;472:69-73.

Serkland DK et al., "VCSELs for atomic clocks," *Proc. SPIE* Feb. 2006;6132:613208 (11 pp.).

Serkland DK et al., "VCSELs for atomic sensors," *Proc. SPIE* 2007;6484:648406 (10 pp.).

Shaeffer DK, "MEMS inertial sensors: A tutorial review," *IEEE Commun. Mag.* Apr. 2013;100-9.

Shkel AM, "Type I and type II micromachined vibratory gyroscopes," *Position, Location, and Navigation Symp.*, held on Apr. 25-27, 2006, pp. 586-593.

Walmsley RG et al., "Micro-G silicon accelerometer using surface electrodes," *IEEE Sensors Conf.*, held on Oct. 25-28, 2009 in Christchurch, New Zealand, pp. 971-974.

Walmsley RG et al., "Three-phase capacitive position sensing," *IEEE Sensors*, held at Kona, Hawaii on Nov. 1-4, 2010, pp. 2658-2661.

Wang MC et al., "A novel tri-axis MEMS gyroscope with in-plane tetra-pendulum proof masses and enhanced sensitive springs," *J. Micromech. Microeng.* 2014;24:045002 (10 pp.).

Weinberg MS et al., "Error sources in in-plane silicon tuning-fork MEMS gyroscopes," *J. Microelectromech. Sys.* Jun. 2006;15(3):479-91.

Xia D et al., "The development of micromachined gyroscope structure and circuitry technology," *Sensors* 2014;14:1394-473.

Yazdi N et al., "Micromachined inertial sensors," *Proc. IEEE* 1998;86(8):1640-59.

Yie Z et al., "Control design for force balance sensors," *American Control Conf.*, held on Jun. 10-12, 2009 in St. Louis, MO, pp. 4208-4214.

\* cited by examiner

US 10,139,564 B1

VERTICALLY INTEGRATED OPTOELECTRONICS PACKAGE FOR MEMS DEVICES

CROSS-REFERENCE TO RELATED APPLICATION

This application claims priority to U.S. Provisional Patent Application No. 62/108,724, filed on Jan. 28, 2015 under the title, "VERTICALLY INTEGRATED OPTOELECTRONICS PACKAGE FOR MEMS DEVICES," the entirety of which is incorporated herein by reference.

STATEMENT OF GOVERNMENT INTEREST

This application was made with Government support under contract no. DE-AC04-94AL85000 awarded by the U.S. Department of Energy to Sandia Corporation. The Government has certain rights in the application.

FIELD

The present application relates to vertically integrated assemblies including a micro-electromechanical systems (MEMS)-based optomechanical architecture. Methods of fabricating such assemblies are also described herein.

BACKGROUND

MEMS-based sensors require diverse electrical, mechanical, and optical connections on an ever-decreasing footprint. In addition, such connections must accommodate complicated executable routines, while minimizing possible noise sources. Additional strategies to provide packaged MEMS structures are needed.

SUMMARY

The present application relates to an integration scheme for MEMS-based devices that employ optoelectronic sensing. In one non-limiting example, the assembly includes a vertically emitting light source (e.g., a VCSEL); a MEMS chip containing a photonic circuit that routes optical signals on and off the chip, as well as electrical circuits that route electrons on and off the chip; and a photodiode chip to convert the optical signal into an electrical signal, as well as pass electrical signals to the MEMS chip. Additional details follow.

Definitions

As used herein, the term "about" means+/−10% of any recited value. As used herein, this term modifies any recited value, range of values, or endpoints of one or more ranges.

By "micro" is meant having at least one dimension that is less than 1 mm. For instance, a microstructure (e.g., any structure described herein) can have a length, width, height, cross-sectional dimension, circumference, radius (e.g., external or internal radius), or diameter that is less than 1 mm.

As used herein, the terms "top," "bottom," "front," "back," "upper," "lower," "above," and "below" are used to provide a relative relationship between structures. The use of these terms does not indicate or require that a particular structure must be located at a particular location in the apparatus.

Other features and advantages of the application will be apparent from the following description and the claims.

BRIEF DESCRIPTION OF THE DRAWINGS

FIG. 4A is a perspective view of an assembly 400 having a proof mass. FIG. 4B is a perspective view of the optical routing scheme for the assembly.

FIG. 4A is a schematic of a packaged sensor assembly. FIG. 4B is an exemplary 3D assembly 5000 including three sensors.

FIG. 4C is an exemplary assembly 500 having integrated modules. FIG. 4D is a plan view of a sensor having integrated chip modules 511, 521, 531.

FIG. 6A is a schematic of an exemplary emitter module 610. FIG. 6B is a photograph of an operating 850 nm VCSEL chip, where one of the four VCSELs are lasing.

FIG. 7A is a schematic of exemplary detector modules having one photodetector 730. FIG. 7B is a schematic of exemplary detector modules having two photodetectors 7321, 7322.

DETAILED DESCRIPTION

Figure 1:
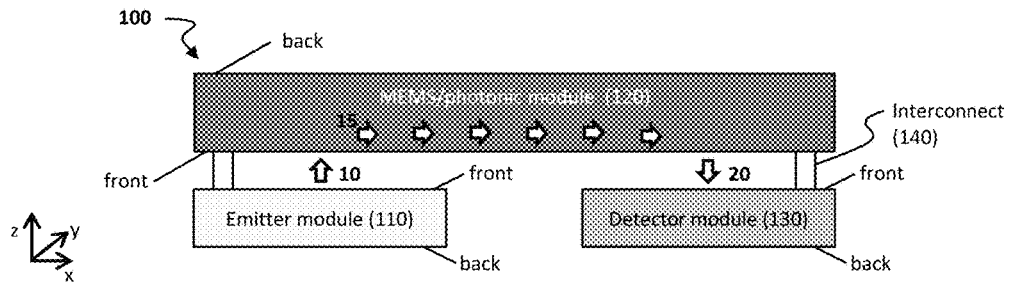
FIG. 1 is a schematic showing an exemplary assembly 100 including various modules.

The present application relates to a vertically integrated assembly including modules, in which the assembly accommodates and transmits optical signals to and from these modules. In one embodiment, the assembly 100 includes a MEMS/photonic module 120, an emitter module 110, and a detector module 130 (FIG. 1). Optionally, the assembly 100 includes one or more interconnects 140 to physically connect the modules.

The assembly 100 allows optical signals to be effectively transmitted between the modules. As can be seen, the emitter module 110 includes a front surface configured to support an optical source (e.g., one or more vertically emitting light sources) and to vertically deliver 10 (e.g., along the z-axis) an optical input signal to the front surface portion (i.e., at least a portion of the front surface) of the MEMS/photonic module 120. The MEMS/photonic module 120 has a front surface configured to receive, relay, and transmit 15 optical signals (e.g., by use of a photonic circuit disposed on at least a portion of the front surface). Finally, the detector module 130 includes a front surface configured to support an optical detector (e.g., one or more photodetectors) and to vertically receive 20 (e.g., along the z-axis) an optical input signal from the front surface portion (i.e., at least a portion of the front surface) of the MEMS/photonic module 120.

Figure 2:
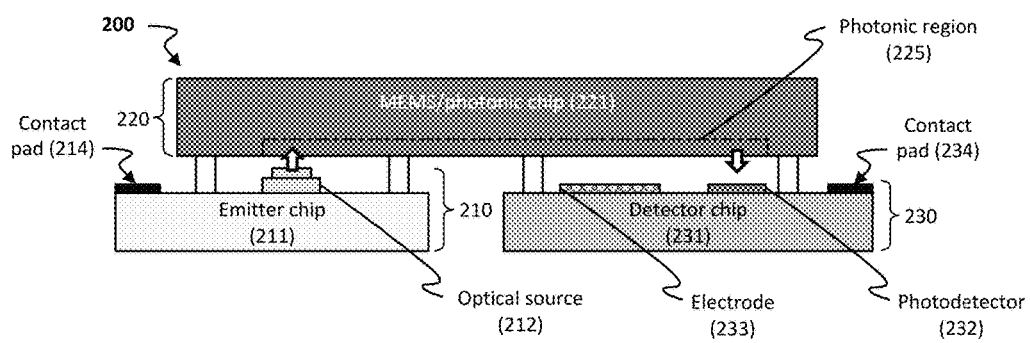
FIG. 2 is a schematic showing another exemplary assembly 200.

The modules can have any useful components. For instance, in one non-limiting embodiment (FIG. 2), the assembly 200 includes a MEMS/photonic module 220 having a photonic region 225 (e.g., a photonic waveguide or a photonic layer) disposed on a MEMS/photonic chip 221, an emitter module 210 including an optical source or emitter 212 disposed on an emitter chip 211, and a detector module 230 including one or more photodetectors 232 disposed on the detector chip 231. The emitter chip 211 and detector chip 231 can include one or more contact pads 214, 234. In addition, the detector chip 231 can include one or more electrodes 233 (e.g., employed to actuate or drive a component in the MEMS/photonic chip, such as a sensing component).

The front surface portions of the emitter and detector modules are configured to detect and emit optical signal(s), and the front surface portion of the MEMS/photonic module is configured to transmit or relay optical signal(s).

In some embodiments, the front surface of a structure indicates a surface that it is configured to receive, relay, and/or transmit an optical signal. For instance, the front surface portion of the emitter module can include one or more optical sources, in which the optical source is disposed on the front surface portion of the module and is configured to transmit an optical input signal in a vertical direction (e.g., along the z-axis). In another instance, the front surface portion of the detector module can include one or more photodetectors, in which the detecting elements of the photodetector is located on the front surface portion of the module and is configured to receive an optical output signal in a vertical direction (e.g., along the z-axis). In yet another instance, the MEMS/photonic module can include a photonic circuit disposed on a front surface of the module, or a portion thereof.

The photonic circuit can include any useful photonic material configured with structures to provide optical waveguides and resonant grating couplers. Non-limiting structures include periodic structures (e.g., arrays of holes, beams, gratings, lattice, etc.) in any useful material or layers of materials. Exemplary materials for photonic structures (e.g., optical waveguides and resonant grating couplers) include silicon, silicon nitride, gallium arsenide, aluminum gallium arsenide, aluminum oxide, silicon oxide, niobium oxide (e.g., niobium pentoxide), other III-V materials, as well as layers, stacks, or combinations of any of these. Other exemplary structures are materials are described in Chow E et al., "Three-dimensional control of light in a two-dimensional photonic crystal slab," *Nature* 2000; 407:983-6; Chow E K C et al., "Demonstration of high waveguide bending efficiency (>90%) in a photonic-crystal slab at 1.5 µm wavelengths," *Proc. SPIE* 2001; 4283:453-61; Jones A M et al., "Ultra-low crosstalk, CMOS compatible waveguide crossings for densely integrated photonic interconnection networks," *Opt. Express* 2013; 21(10):12002-13; and Augustin M et al., "Dispersion properties of photonic crystal waveguides with a low in-plane index contrast," *New J. Phys.* 2006; 8:210, each of which is incorporated herein by reference in its entirety.

The modules can be aligned in any useful manner. Generally, the front surface portions of the detector and emitter modules are aligned with the front surface portion of the MEMS/photonic module. In this way, the detector and emitter modules are vertically integrated with the MEMS/photonic module. Optionally, a substrate can be aligned and bonded to the back surface portion of the MEMS/photonic module.

When useful, the MEMS/photonic module can include a sensing structure (e.g., a proof mass) that is configured to be driven by one or more drivers (or actuators), and such drivers can be integrated into the detector module, the emitter module, or the MEMS/photonic module. In some embodiments, the driver includes a set of opposing electrodes (i.e., including a first electrode disposed opposite to the second electrode), in which the first electrode is disposed on a surface of the sensing structure and the second electrode is disposed on a surface that is opposite of the surface of the sensing structure (e.g., disposed on a surface of the vertically integrated detector module). Alternatively, the second electrode can be disposed on a surface of the frame that is opposite of the surface of the sensing structure. Other configurations can be used, as understood by a skilled artisan.

Inertial Sensor Assembly

The assembly of the application can be configured as an inertial sensor assembly. In this exemplary use, the MEMS/photonic module includes a sensing structure that is a proof mass and an optical resonator sensor that is an optical displacement sensor (e.g., a nano-optomechanical displacement sensor).

Figure 3:
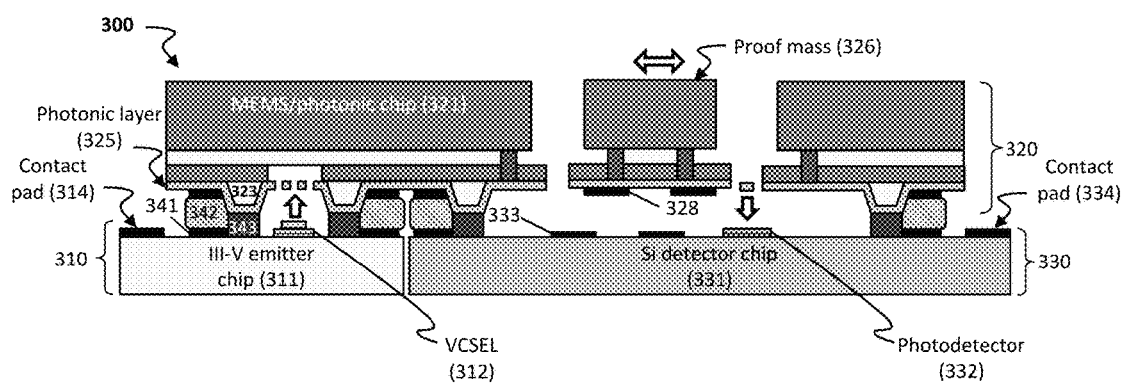
FIG. 3 is a plan view of an assembly 300 having integrated chip modules 311, 321, 331.

An exemplary inertial sensor assembly is provided in FIG. 3. The assembly 300 includes a MEMS/photonic module 320, a detector module 330, and an emitter module 310. The MEMS/photonic module 320 includes a MEMS/photonic chip 321, which forms a frame around the sensing structure (the proof mass 326) configured to be driven along the drive axis (indicated by a white double-headed arrow). The proof mass 326 includes one or more electrodes 328 (e.g., for electrostatically driving the proof mass). The chip 321 also includes a photonic layer 325 including optical waveguides that direct optical signals along the photonic layer 325 and optical resonant grating couplers that vertically direct optical signals to and from the emitter module(s) 310 and/or detector module(s) 330.

The emitter module 310 includes a III-V emitter chip 311 having a vertical cavity surface emitting laser 312 (VCSEL) aligned with a portion of the photonic layer 325 (e.g., a waveguide or a resonant coupler) that directs the optical input signal from the VCSEL 312 to the nano-optomechanical displacement sensor. The aligned III-V emitter chip 311 is bonded to the MEMS/photonic chip 321 by way of a solder material 342 disposed between a metal bond pad 341 on the emitter chip 311 and another metal bond pad on the MEMS/photonic chip 321 (e.g., thereby forming an interconnect). Vertical alignment and bonding can be facilitated by any useful structure. For instance, a mesa 323 and/or a post 343 can be employed to provide a fixed gap between modules.

The detector module 330 includes a Si detector chip 331 having a photodetector 332 aligned with a portion of the photonic layer 325 (e.g., a waveguide or a resonant coupler) that directs the optical signal from the nano-optomechanical displacement sensor to the photodetector 332. The chip 331 can include one or more electrodes 333 (e.g., for electrostatically driving the proof mass). Similar to the III-V emitter chip, the Si detector chip 331 is aligned and bonded to the MEMS/photonic chip 321 by way of solder disposed between metal bond pads and by way of mesa-post structures. Chips can include one or more contact pads 314, 334 to electrically connect the inertial sensor (e.g., to leads on a package).

Interconnects between modules can include any useful structure. For instance, the interconnect can include a metal bond pad 341 disposed on a front surface portion of the emitter chip 311, a second metal bond pad disposed on a front surface portion of the MEMS/photonic chip 321, and a solder material 342 that electrically connects the first metal bond pad 341 to the second metal bond pad. The interconnect can also include or be in proximity to one or more structures configured to provide a fixed gap between the different modules. For instance, the metal bond pads can be disposed in proximity to one or more mesas 323 disposed on a front surface portion of the MEMS/photonic chip 321 and in proximity to one or more posts 343 disposed on a front surface portion of the emitter chip 311. In this way, the mesa-post structures assist in the process of flip chip integration by providing a fixed chip-to-chip gap, a hard stop during bonding, and/or a solder dam that routes any solder material (employed to electrically connect aligned metal bond pads) away from active elements. Such mesa-post and metal bond pad-solder-metal bond pad structures can be located between any useful modules (e.g., between the MEMS/photonic module and detector module or between the MEMS/photonic module and the emitter module), as well as on any useful portion of the modules (e.g., any useful location on the front surface of the module, such as on the peripheral edge of a front surface of the module).

Figure 4A:
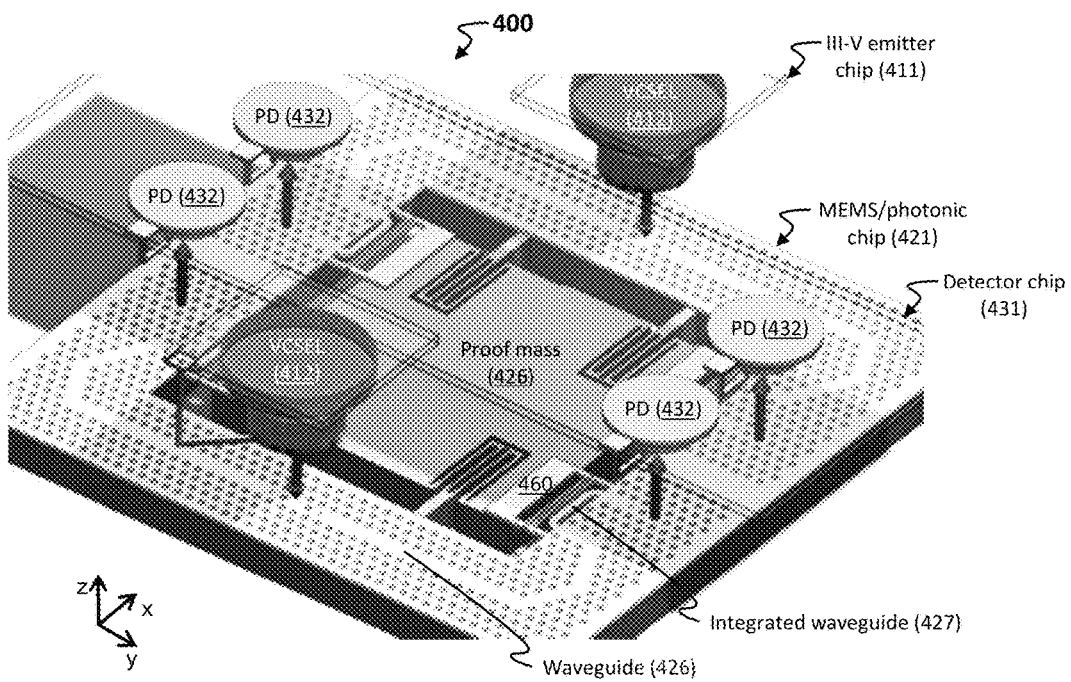
FIG. 4A-4B provides the components of exemplary assembly 400.
Figure 4B:
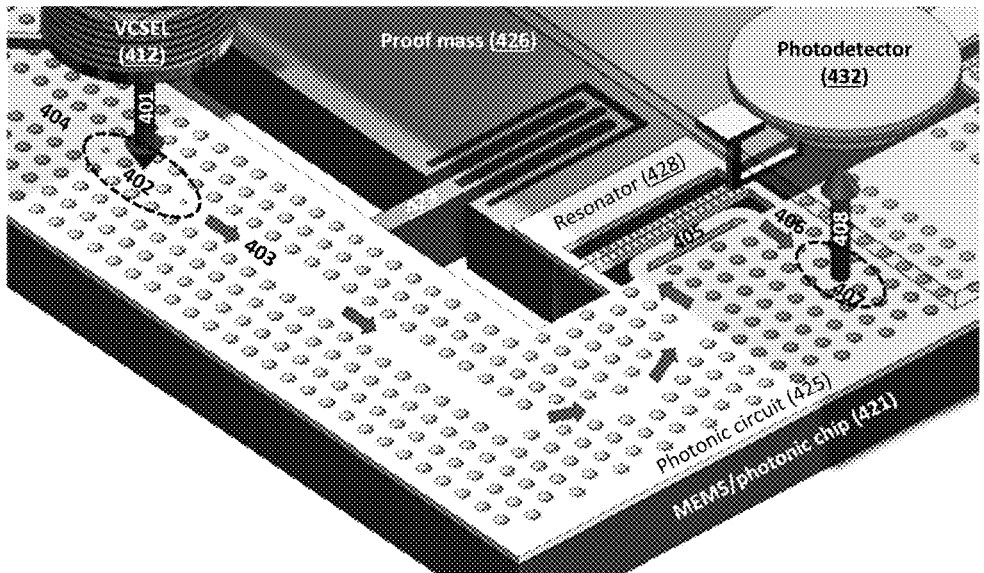

Another exemplary inertial sensor assembly 400 is seen in FIG. 4A-4B. The assembly 400 includes a MEMS/photonic module including a proof mass 426 architecture with a plurality of integrated optical displacement sensor 460. As can be seen, the assembly 400 includes four displacement sensors, each of which are located in proximity to a flexure 429 suspending the proof mass 426 (FIG. 4B). Optical signals are routed to and from the sensor by way of a photonic circuit 425 disposed above a substrate or a chip 421. The photonic circuit 425 can include one or more optical waveguides 426, integrated waveguides 427 (e.g., optically connected to one or more displacement sensors), or resonator grating couplers 402, 407.

Force-balanced feedback of the proof mass can be optionally employed by using a capacitive force actuator, which includes a surface electrode disposed on a surface portion of the proof mass and a fixed electrode disposed in a fixed relationship from the surface electrode (e.g., where the fixed electrode is disposed on a detector module disposed in a fixed gap distance as determined by one or more posts, mesas, interconnects, metal bond pads, and/or solder material, as described herein). Arrays of such electrodes can also be employed. Force-balanced feedback can be realized in any useful manner. In one instance, a feedback loop can be configured to provide an output voltage signal to the electrodes, thereby maintaining the proof mass motionless. Additional electrodes can be present on the proof masses and detector module. For instance, sensor electrodes can be provided on a sensing frame, e.g., as described herein.

Chip-level vertical integration of the detector module and emitter module allows for compact, robust packaging. The detector module includes photodetectors (PD) 432 arrayed on a front surface portion of a detector chip 431. This module can further include one or more electronic components (e.g., a transimpedance amplifier to convert an electrical output signal from the photodetector into a first voltage signal). Use of emitter modules provides efficient delivery of the optical input signal by way of vertical cavity surface emitting laser sources 412 disposed on a front surface portion of a III-V emitter chip 411.

FIG. 4B illustrates how VCSEL laser light can be routed onto the MEMS/photonic chip to the optical displacement sensor and how the transmitted light will be routed to the silicon detector chip. In one exemplary architecture, each VCSEL 412 is coupled vertically 401 into the photonic circuit 425 via an input resonant grating coupler 402 that is embedded in a photonic crystal. The grating coupler 402 can also act as a splitter, which splits the light into two photonic crystal waveguides 403, 404 running in opposite directions on the chip (one of these paths is highlighted by gray arrows in FIG. 4B). These waveguides 403, 404 can be configured to route optical signals to two optical displacement sensors on opposing sides of one portion of the Coriolis sense mass. The optical displacement sensor can be based on a zipper optical cavity, as described in Eichenfield M et al., "A picogram- and nanometer-scale photonic-crystal optomechanical cavity," *Nature* 2009 May; 459:550-5; Blasius T et al., "Chip-scale cavity-optomechanical accelerometer," *Conf. on Lasers and Electro-Optics* (*CLEO*): *Science and Innovation*, held on 9-14 Jun. 2013 in San Jose, Calif., abstract CW3F.1 (2 pp.); Davanço M et al., "Slot-mode-coupled optomechanical crystals," *Opt. Express* 2012; 20(22):24394-410; and Krause A G et al., "A high-resolution microchip optomechanical accelerometer," *Nat. Photon.* 2012; 6:768-72, as well as U.S. Pub. No. 2013/0121633 and Int. Pub. No. WO 2013/131067, each of which is incorporated herein by reference in its entirety.

As can be seen, one waveguide 403 directs the optical signal to an integrated waveguide 405 that is coupled to a first resonating portion of the displacement sensor 460. The second resonating portion 428 is located on the proof mass 426, which is suspended within the frame opening by flexures 429. The first and second resonating portions are optically coupled, such that moving one resonating portion away from the other causes decoupling and results in a change in resonant frequency. This change, in turn, results in an increased optical output signal, as compared to an optical signal observed for coupled resonating portions. As applied herein, the second resonating portion is located on the proof mass, such that movement of the proof mass results in optical decoupling of the resonating portions. In this manner, movement of the proof mass can be detected optically.

After interacting with the displacement sensor, the transmitted light (which now carries the sense mass displacement information) is routed via a second photonic crystal waveguide 406 to a second vertical grating coupler 407, which is coupled vertically 408 with a silicon photodiode detector 432.

Multiple optical sources, optical detectors, and proof masses can be employed to remove mode noise and to provide differential signal information. For instance, when two displacement sensors are coupled to each VCSEL, these two sensors form a differential pair that allows for removal of common mode noise, such as relative intensity noise on the VCSEL. A second, independent set of VCSEL, detectors, and photodetectors can be employed to form another differential pair on the other portion of the Coriolis sense proof mass. The two differential signal pairs can be subtracted or added to yield the rotation rate or acceleration of the sensor assembly, respectively. In addition, two proof masses can be used to distinguish between linear acceleration or rotational acceleration (e.g., yaw).

Additional MEMS structures and electronic configurations are described in Milligan D J et al., "An ultra-low noise MEMS accelerometer for seismic imaging," *Proc. IEEE Sensors*, held on 28-31 Oct. 2011, in Limerick, Ireland, pp. 1281-4; Serkland D K et al., "VCSELs for atomic clocks," *Proc. SPIE* 2006 February; 6132:613208 (11 pp.); Homeijer B D et al., "A brief test of the Hewlett-Packard MEMS seismic accelerometer," U.S. Geological Survey Open-File Report 2014-1047, 22 pp., available pubs.usgs.gov/of/2014/1047/pdf/ofr2014-1047.pdf); Homeijer B et al., "Hewlett Packard's seismic grade MEMS accelerometer," *IEEE 24th Int'l Conf. on Micro Electro Mechanical Systems* (*MEMS*), held on 23-27 Jan. 2011 in Cancun, Mexico, pp. 585-8; Shaeffer D K, "MEMS inertial sensors: A tutorial review," *IEEE Commun. Mag.* 2013 April; 100-9; Weinberg M S et al., "Error sources in in-plane silicon tuning-fork MEMS gyroscopes," *J. Microelectromech. Sys.* 2006 June; 15(3): 479-91; Yazdi N et al., "Micromachined inertial sensors," *Proc. IEEE* 1998; 86(8):1640-59; Walmsley R G et al., "Micro-G silicon accelerometer using surface electrodes," *IEEE Sensors Conf.*, held on 25-28 Oct. 2009 in Christchurch, New Zealand, pp. 971-4; Guo Z Y et al., "A lateral-axis micromachined tuning fork gyroscope with torsional Z-sensing and electrostatic force-balanced driving," *J. Micromech. Microeng.* 2010; 20:028007 (7 pp.); Shkel A M, "Type I and type II micromachined vibratory gyroscopes," *Position, Location, and Navigation Symp.*, held on 2006 Apr. 25-27, pp. 586-93; and Khanhua S et al., "Design and simulation of MEMS based tuning fork micro-gyroscope," *Appl. Mech. Mater.* 2012; 110-116:5036-43, each of which is incorporated herein by reference in its entirety.

Packaged Assemblies

Figure 5A:
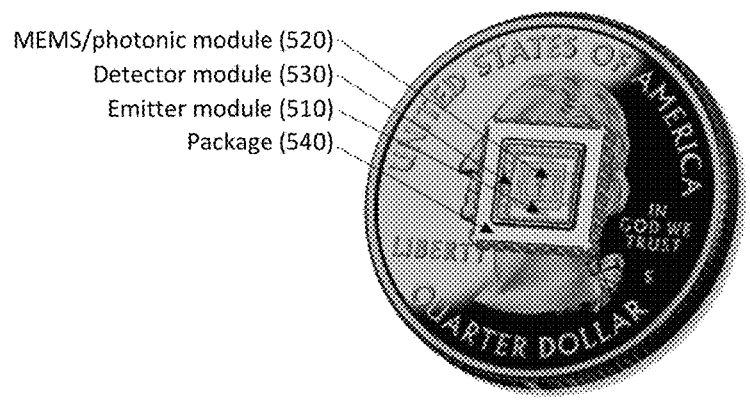
FIG. 5A-5D provides exemplary modules and assemblies.
Figure 5B:
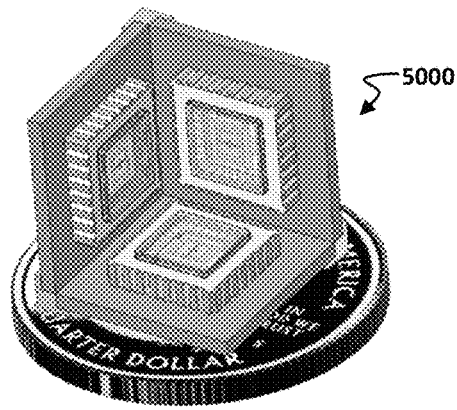

The assembly can be packaged in any useful manner. For instance, FIG. 5A provides a packaged assembly, which can include a package 540 that encapsulates the MEMS/photonic module(s) 520, detector module(s) 530, and emitter module(s) 510. Furthermore, the architecture can include a plurality of packaged assemblies. For instance, the assembly 5000 in FIG. 5B is a 3D assembly including three packaged assemblies, where the substrate for each packaged assembly is parallel to one of the three adjoining planes that form a vertex for a cube. In this manner, the adjoining edges of two packaged assemblies form a cube edge.

Figure 5C:
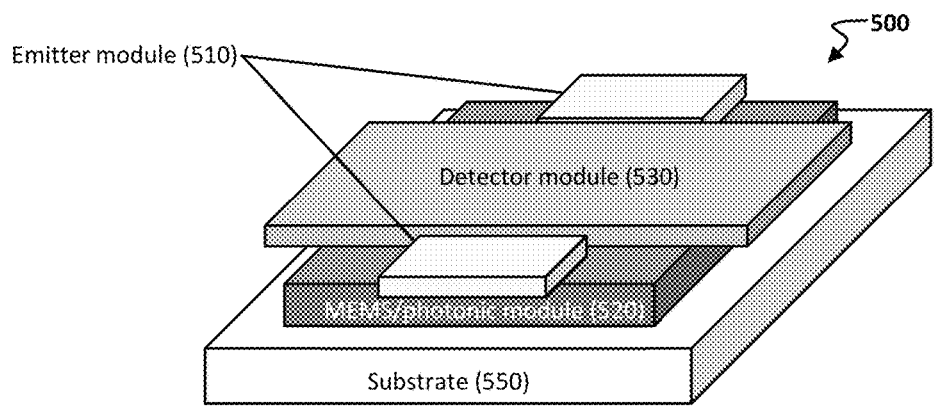

Within the package, the modules can be arranged in any useful manner. For instance, as seen in FIG. 5C, the assembly 500 can include two emitter modules 510 disposed on opposite sides of the detector module 530. The front surface portions of the emitter modules 510 and detector modules 530 are aligned with a front surface portion of the MEMS/photonic module 520, and these aligned modules are disposed on a surface portion of a substrate 550. Such a configuration can be useful if more than one optical displacement sensors are provided, thereby requiring more than one emitter modules to provide optical signals for the displacement sensors.

Figure 5D:
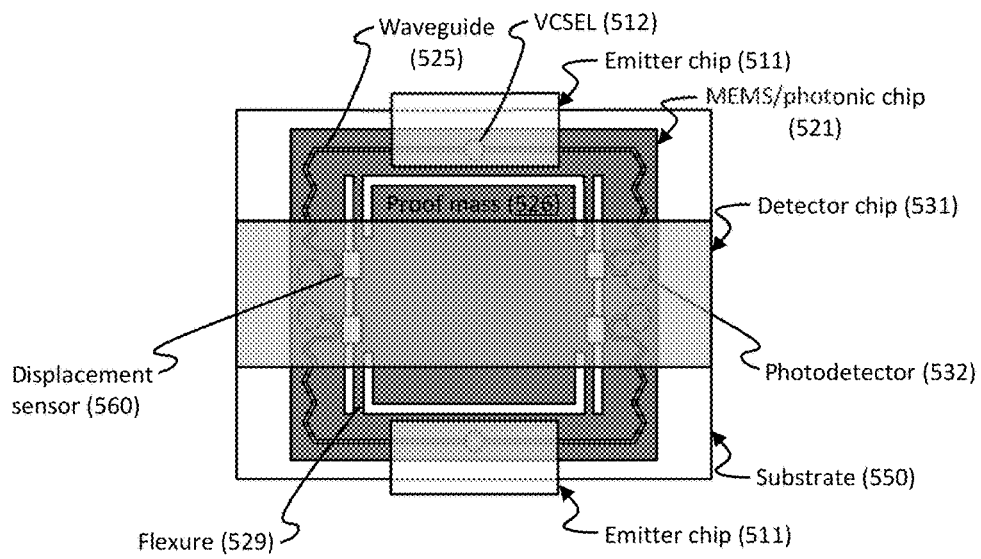

A plan view of the chips is shown in FIG. 5D. The substrate 550 supports the MEMS/photonic chip 521, and the emitter chips 511 and detector chip 531 are aligned with the MEMS/photonic chip 521. As can be seen, the VCSEL 512 from the emitter chip 511 is aligned to a waveguide 525 that directs the optical signal to the displacement sensor 560, which is located in proximity to the proof mass 526 suspended by flexures 529. The photodetector 532 is aligned to another portion of the waveguide 525 that directs the optical signal away from the proof mass 526. Here, the detector chip and emitter chips are vertically aligned and bonded to the MEMS/photonic chip to form the sensor assembly.

Vertical alignment and bonding of modules provide several advantages. First, it drastically decreases the overall in-plane footprint of the sensor assembly. For instance, when a 3D assembly is employed form a 6-axis inertial sensor, in-plane dimensions are reduced, which ultimately decreases the overall volume of the sensor. Second, from a practical standpoint, vertical alignment of modules allows us to use significantly more bonding area, which increases the strength and yield of chip-to-chip bonding and in-turn increases manufacturability commercial viability.

Optical Source and Detector

The assembly can include one or more optical sources and optical detectors. For instance, a zipper cavity nano-optomechanical displacement sensor requires a stable, low-noise laser source with approximately 0.1 mW of optical power and a low-noise optical detector. Exemplary ultra-low threshold, ultra-low noise optical sources and detectors include vertical cavity surface emitting lasers (VCSELs), light emitting diodes (LEDs), and silicon photodetectors for chip-scale atomic spectroscopy, such as those described in Serkland D K et al., "VCSELs for atomic sensors," *Proc. SPIE* 2007; 6484:648406 (10 pp.) and Serkland D K et al., *Proc. SPIE* 2006 February; 6132:613208 (11 pp.), each of which is incorporated herein by reference in its entirety.

In one embodiment, the optical source is one or more vertically emitting chip-scale laser sources having a frequency substantially equal to the optical resonant frequency plus or minus half the optical resonant linewidth. The laser source can be rigidly bonded to the MEMS/photonic module and coupled into the photonic circuit. In particular, VCSELs produce stable, single longitudinal mode outputs having approximately 2 mW of optical power and greater than 30% electrical-to-optical efficiency, which is critical for achieving extremely low system-wide power consumption. Furthermore, they produce high quality TEM00 spatial mode outputs with nearly diffraction-limited mode-field diameters, providing excellent coupling efficiency into the necessary single-mode optical elements that route light to and from the optical displacement sensor.

Figure 6A:
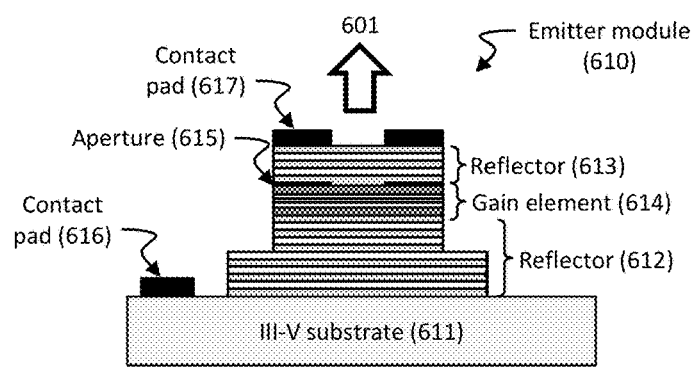
FIG. 6A-6B provides an exemplary vertically integrated optical source.

FIG. 6A provides an exemplary emitter module 610 including a VCSEL having a pair of reflectors 612, 613 disposed around a gain element 614 (e.g., a quantum-well active region that includes one or more quantum-well layers (e.g., including gallium arsenide and/or indium gallium arsenide nitride)). This stack is disposed on a III-V substrate 611 having a contact pad 616. The VCSEL also includes an aperture 615 (e.g., configured to determine the beam size of the emitted optical signal 601) and one or more contact pads 617 (e.g., configured to supply electrical current to the VCSEL). Other VCSEL structures and methods of their fabrication are described in U.S. Pat. Nos. 5,493,577, 5,568, 499, and 8,228,964, each of which is incorporated herein by reference in its entirety.

Figure 6B:
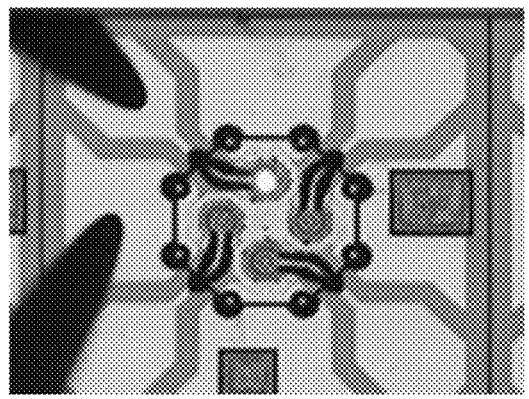

Single-frequency VCSELs include those for atomic spectroscopy of ytterbium (ions), rubidium, and cesium spanning most of the near-infrared spectrum: at specific wavelengths of 739 nm (for $Yb^+$), 780 nm (for Rb), 795 nm (for Rb), 852 nm (for Cs), 894 nm (for Cs), and 935 nm (for $Yb^+$). A photograph of an operating 850 nm VCSEL is shown in FIG. 6B, where the 0.5 mm-square chip of GaAs actually contains four VCSELs, one of which is lasing. All VCSELs are located on a circle of diameter 0.1 mm in the center of the chip, and each has an active emitting aperture diameter of about 4 µm.

Low-noise silicon optical detectors are also desired, such as those used for chip-scale atomic spectroscopy that have voltage and current noise levels that allow us to achieve shot-noise-limited operation with the power levels typical of the VCSELs. In one embodiment, the detector is a vertically integrated photodetector. An optical signal can be transmitted from the displacement sensor, which is routed by the photonic circuit and emitted to be absorbed by the photodetector, producing a photocurrent proportional to the amount of light transmitted past the displacement sensor. When the assembly includes a proof mass, then an applied inertial force causes displacement of the proof mass, thereby changing the distance between the two resonating portions of the displacement sensor and causing its resonant frequency to change. This, in turn, causes the amount of transmitted light to change and the photocurrent to change.

Figure 7A:
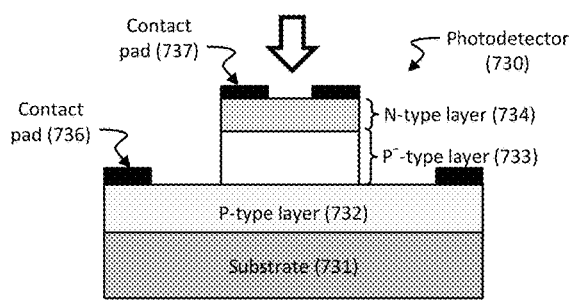
FIG. 7A-7B provides an exemplary vertically integrated photodetector.
Figure 7B:
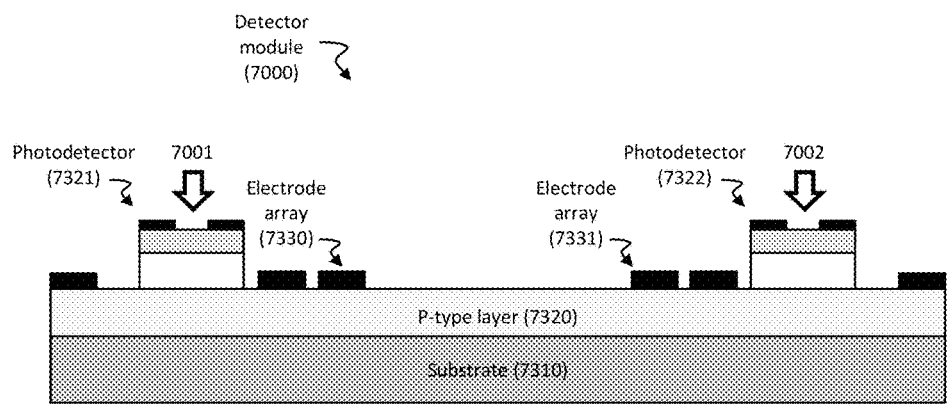

The photodetector can have any useful configuration, such as those possessing a semiconductor p-i-n junction (e.g., formed from a III-V material, such as gallium arsenide, indium gallium arsenide, and/or indium phosphide). FIG. 7A provides an exemplary photodetector 730 including a contact pad 737 disposed on a stack including an n-type layer 734 and a p⁻-type layer 733. This stack, in turn, is disposed on a p-type layer 732 and a substrate 731 having one or more contact pads 736. Each detector module can include one or more photodetectors. As shown in FIG. 7B, the detector module 7000 can include two photodetectors 7321, 7322, where each is configured to receive an optical signal 7001, 7002. The detector module 7000 can include one or more electrode arrays 7330, 7331 (e.g., as described herein) disposed on a p-type layer 7320 and a substrate 7310.

The optical components of the sensor, as well as the modules including such components, can include one or more other optoelectronic structures, such as specialty semiconductor lasers, integrated VCSEL-RCPD circuits (vertical-cavity surface-emitting lasers, resonant-cavity photodiodes), photonic integrated circuits (e.g., GaAs- and/or InP-based circuits), optical amplifiers, optical modulators, photodetectors, optical switches, planar lightwave circuits (e.g., SiON materials set) such as various optical guided-wave filters and switches, optical data links, micromirror arrays, subsystems for switch matrices and adaptive optics, radio-frequency switches, optical networks that include phase shifters and tunable filters, power amplifiers, low-noise amplifiers, rad-hard heterojunction bipolar transistors, and/or high-electron mobility transistors.

Drivers and Actuators

The sensor can include any useful driver(s) and/or actuator(s) for its operation. In one instance, the drive masses (e.g., proof masses) can be configured to have a steady large velocity and low power drive for the sensor to operate. Such a configuration can be applied by using advanced electrostatic techniques to actuate the drive masses (e.g., proof masses) as well as a coarse drive mass sensor for stable closed loop drive operation. In further embodiments, the sense masses (e.g., proof masses or proof masses including a portion of the sensing frame) can include one or more sensing electrostatic actuators or electrodes for closed loop operation.

In one embodiment, the sensor is configured for three-phase capacitive sensing. For instance, the capacitive force actuator can include at least two surface electrodes disposed on a surface portion of the proof mass and at least three fixed electrodes disposed in a fixed relationship with at least one surface electrode. Between these five electrodes, there can be six variable capacitors. For each surface electrode, there are three variable capacitances (i.e., between the surface electrode and each of the three opposing fixed electrodes). In addition, there is a 120° shift between each capacitance value (hence, "three-phase"). In this geometry, the variable capacitances are a periodic function of the position of the proof mass. Capacitance for this three-phase electrode arrangement is measured by applying a carrier signal (e.g., a sinusoidal carrier signal) to each of the fixed electrodes, measuring the resultant output signals (e.g., by way of an amplifier connected to the surface electrodes), demodulating and optionally differentially combining the resultant output signals (e.g., to provide a final output signal), and determining a displacement value of the proof mass (e.g., by employing a decoder that determines a magnitude of the displacement of the proof mass or an acceleration of the proof mass relative to the frame from the at least three signal outputs). Exemplary methods and electrode arrangements are discussed in U.S. Pat. No. 7,484,411 and Walmsley R G et al., "Three-phase capacitive position sensing," *IEEE Sensors*, held at Kona, Hawaii on 1-4 Nov. 2010 (pp. 2658-61), each of which is incorporated herein by reference in its entirety.

Actuators can have any useful geometry and configuration, such as comb drives, electrode plates, finger electrodes, driving electrodes, and moveable electrodes, including those described in U.S. Pat. Nos. 7,213,458, 7,484,411, 8,205,497, 8,272,266, and 8,776,337, each of which is incorporated herein by reference in its entirety. Such actuators can be disposed on any useful structure, such as a surface of the proof mass, the sensing frame, the driving frame, a cap wafer suspended above the proof mass, a stator wafer located below the proof mass (e.g., further optionally configured to provide a ground reference to any electrode), a detector module, and/or an emitter module.

Additional electronic components can be present to control the drivers and actuators, such as a driving circuit configured to transmit electronic signals to the proof mass (es) in order to impart the driving motion or to apply biasing signals, such as those including a transimpedance amplifier, a differentiator stage, a variable-gain amplifier circuit, a controller, and/or a phase-locked-loop circuit; a sensing circuit operatively coupled to the one or more displacement sensors and/or sensing electrodes, where the sensing circuit can include one or more charge amplifiers, filters, demodulators, demodulation stages, and/or mixers; an electronic control unit, such as a microcontroller, microprocessor, etc.; as well as any other useful components, such as those described in U.S. Pat. Nos. 7,275,433, 8,087,295, 8,459,110, 8,726,730, and 8,783,106, as well as Xia D et al., "The development of micromachined gyroscope structure and circuity technology," *Sensors* 2014; 14:1394-473; Yie Z et al., "Control design for force balance sensors," *American Control Conf*, held on 10-12 Jun. 2009 in St. Louis, Mo., pp. 4208-14; and Lemkin M A et al., "A 3-axis force balanced accelerometer using a single proof-mass," *Int'l Conf. on Solid State Sensors and Actuators*, held on 16-19 Jun. 1997 in Chicago, Ill., vol. 2, pp. 1185-8, each of which is incorporated herein by reference in its entirety.

Methods of Fabricating Sensors

The present application also includes methods of fabricating sensors. As described herein, components of the sensors can be formed as modules (e.g., MEMS/photonic modules, detector modules, and emitter modules). These modules, in turn, can be aligned to form the integrated sensor. Alignment and spacing is critical to achieve high efficiency optical transmission from the emitter module to the photonic circuit on the MEMS/photonic modules and then back to a detector module. Any useful alignment and spacing methodologies can be employed, e.g., such as flip chip integration, which sets the chip-to-chip gap via thin film stack with a thickness that is very well controlled. The film stack can form mesas to serve as a hard stop during bonding (see, e.g., mesa 323 in FIG. 3). In addition, they serve as dams to ensure any solder spill is moved in the direction away from the active elements.

Figure 8:
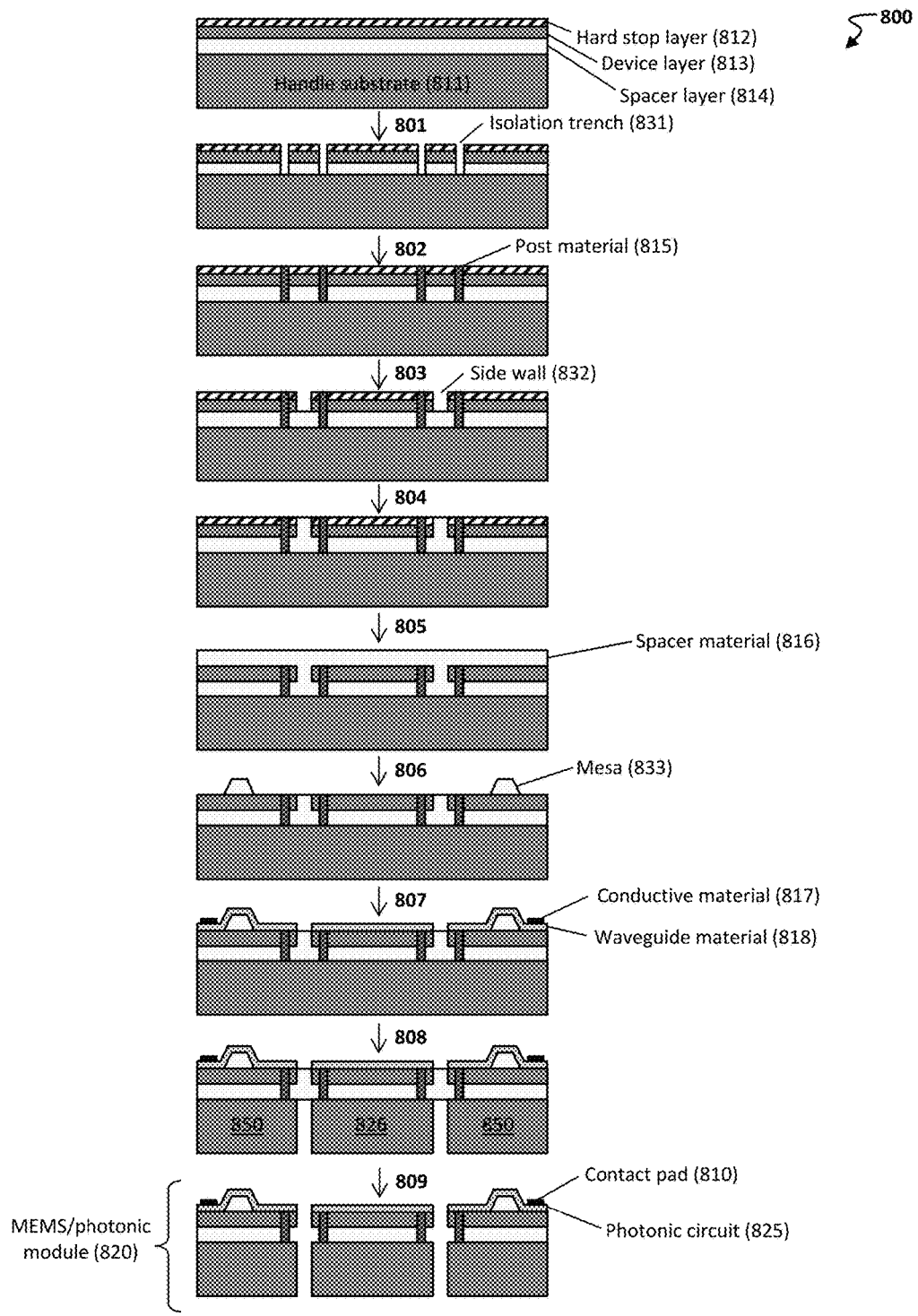
FIG. 8 provides an exemplary method 800 for fabricating a non-limiting MEMS/photonic module 820.

FIG. 8 provides an exemplary method 800 for fabricating the MEMS/photonic module. This method includes providing a stack having a handle substrate 811, a spacer layer 814, a device layer 813, and a hard stop layer 812 (e.g., a silicon-on-insulator (SOI) substrate with a silicon nitride hard stop layer, such as a substrate having a silicon handle substrate, a buried oxide spacer layer, a single crystal silicon device layer, and a silicon nitride hard stop layer). In particular embodiments, use of a SOI wafer allows for the separation of large and fine features to be defined in the MEMS/photonic module. For instance, various mesa and alignment features can be defined on one side of the wafer (e.g., the front surface portion of the wafer), whereas high aspect ratio flexures and/or the massive bulk machined proof masses can be defined through the other surface of the wafer (e.g., the back surface portion of the wafer).

The next steps define the MEMS structures. In an etching step 801, one or more isolation trenches 831 are etched into the stack (e.g., into the hard stop, device, and spacer layers). In a deposition step 802, a post material 815 (e.g., silicon, such as polysilicon) is deposited into the one or more isolation trenches. Optionally, this step 802 is followed by a polishing step that lands on the hard stop layer 812. In a further etching step 803, one or more side walls 832 of a MEMS structure are etched into the hard stop layer 812 and the device layer 813, and optionally into a portion of the spacer layer 814. In a fill step 804, the side wall 832 is filled with an etchable material (e.g., an oxide material). Optionally, this step is followed by a polishing step that lands on the hard stop layer 812.

The following steps define the photonic circuit and one or more alignment features on the front surface portion of the MEMS/photonic module. In an etch step 805, the hard stop layer 812 is etched, and a spacer material 816 (e.g., an oxide) is deposited. Then, in a patterning step 806, one or more mesas 833 are defined. A deposition step 807 is performed to deposit the waveguide material 818 (e.g., silicon nitride or any other material herein) on a front surface portion of the stack, which is followed by a metallization step to pattern one or more conductive materials 817. The deposition and metallization steps can be performed in any useful order. In a backside etching step 808, one or more trenches are formed, e.g., to define an opening in the frame 850, which in turn isolates the MEMS structure (e.g., a proof mass 826 from the frame 850). Although not seen in this schematic view, one or more flexures suspend the proof mass within the opening of the frame. In a final release step 809, the spacer layer 814 is etched (e.g., in a high frequency dip) to release the proof mass 826, thereby providing a MEMS/photonic module 820 having a photonic circuit 825 and one or more contact pads 810.

Exemplary methods for making and testing MEMS-based and photonic-based sensors are described in such in U.S. Pat. Nos. 7,066,004, 7,106,448, 7,148,436, 7,212,944, 7,275,433, 7,355,720, 8,087,295, 8,205,497, 8,459,110, 8,680,810, 8,726,730, and 8,783,106, as well as U.S. Pub. No. 2013/0121633, each of which is incorporated herein by reference in its entirety.

EXAMPLES

Example 1: Integrated Assembly

The present application relates to integrated assemblies including various modules to provide an optical signal, route the optical signal, and then detect the optical signal. As shown in FIG. 4A, an exemplary integrated assembly 400 includes a vertically emitting light source, such as a VCSEL 412 on a III-V emitter ship 411; a MEMS/photonic chip 421 including a photonic circuit 425 that routes optical signals on and off the chip, as well as electrical circuits that route electrons on and off the chip; and a detector chip 431 including one or more photodiodes (PD) 432 to convert the optical signal into an electrical signal, as well as pass electrical signals to the MEMS/photonic chip 421. The MEMS/photonic chip 421 can include any useful sensing structure, such as a proof mass 426. Furthermore, the photonic circuit 425 disposed on the MEMS/photonic chip 421 can include one or more waveguides 426 and integrated waveguides 427.

In particular, the VCSEL chips 411 and the silicon photodetector chip 431 can be vertically aligned and bonded to the MEMS/photonic chip 421 to form a fully integrated optical signal path that routes photons from the VCSEL 412, onto the MEMS/photonic chip 421, and back to the photodetectors 432 on the photodiode chip 431. As shown in FIG. 4B, the photons are directed vertically 401 via a resonant grating coupler 402 that is embedded in a photonic crystal of the photonic grate. The grating coupler 402 can also act as an extremely precise on-chip 50/50 splitter, which splits the light into two photonic crystal waveguides 403, 404 running in opposite directions on the chip. These low-loss photonic crystal waveguides route the light to various elements on the MEMS/photonic chip 421, such as the optical displacement sensor 460 based on an optical cavity resonator 428 that senses the motion of the proof mass 426 suspended by its flexures 429 and that relays this sensed motion to the integrated waveguide 405 that is optically connected to the photonic circuit 425.

After interacting with the MEMS/photonic chip 421, the transmitted light (which now carries information) is routed via a second photonic crystal waveguide 406 to a second vertical grating coupler 407, which is aligned with a silicon photodiode detector 432. The two optical paths from the same VCSEL can form a differential pair that removes common mode noise, such as relative intensity noise on the VCSEL.

Example 2: Fabrication Methods for Vertically Integrated Assemblies

The present application relates to vertically aligned and integrated assemblies, as well as methods of making such assemblies. Alignment and spacing is critical to achieve high efficiency optical transmission from the VCSEL chip to the waveguides on the MEMS/photonic chip and then back to a Si detector chip. In one embodiment, the present application employs a process of flip chip integration that sets the chip-to-chip gap via a thin film stack having a thickness that is very well controlled. The film stack includes mesas that will serve as a hard stop during bonding. In addition, they serve as dams to ensure any solder spill is moved in the direction away from the active elements.

FIG. 3 provides an exemplary vertically integrated assembly. The assembly 300 includes a MEMS/photonic module 320, a detector module 330, and an emitter module 310. These modules are vertically aligned and bonded to ensure a secure optical path from the emitter module 310 to the MEMS/photonic module 320, and then to the detector module 330. In particular, the emitter module 310 includes a vertical cavity surface emitting laser 312 (VCSEL) aligned with a portion of the photonic layer 325 (e.g., a waveguide) that directs the optical signal from the VCSEL 312 to the MEMS/photonic chip 321 (e.g., an optical cavity sensor on this chip). The MEMS/photonic chip 321 includes a photonic layer 325 including optical waveguides that direct optical signals along the photonic layer 325 and optical resonant grating couplers that vertically direct optical signals. The detector module 330 includes a photodetector 332 aligned with a portion of the photonic layer 325 (e.g., a waveguide) that directs the optical signal from the MEMS/photonic chip 321 to the photodetector 332. Similar to the III-V emitter chip 311, the Si detector chip 331 is aligned and bonded to the MEMS/photonic chip 321 by way of solder disposed between metal bond pads.

The modules are aligned by way of mesa and post structures, whereas bonding is achieved by way of interconnects formed by solder material between metal bond pads. To ensure that solder material is maintained away from active elements, mesas and posts can be positioned in proximity to metal bond pads that will be soldered in the bonding step. The dimensions of the mesas and posts can be optimized to provide the desired gap distance between the modules. In addition, such mesas and posts can be located on any useful portion of the modules (e.g., along the periphery of the front surface portion of the modules). In this way, the mesa-post structures assist in the process of flip chip integration by providing a fixed chip-to-chip gap, a hard stop during bonding, and/or a solder dam that routes any solder material (employed to electrically connect aligned metal bond pads) away from active elements.

Other Embodiments

All publications, patents, and patent applications mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. An integrated assembly comprising:
 a MEMS/optoelectronic module comprising a photonic circuit;
 one or more emitter modules, wherein each emitter module comprises one or more vertically emitting light sources, wherein each vertically emitting light source is directly optically connected to a portion of the photonic circuit and configured to provide an optical input signal to the photonic circuit, wherein each emitter module is displaced in a direction normal to a plane of the photonic circuit, and wherein an optical axis of each vertically emitting light source is substantially parallel to the normal to the plane of the photonic circuit; and
 one or more detector modules, wherein each detector module comprises one or more vertically integrated photodetectors, wherein each vertically integrated photodetector is directly optically connected to a portion of the photonic circuit and configured to receive an optical output signal from the photonic circuit and to transmit an electrical output signal, wherein each detector module is displaced in the direction normal to the plane of the photonic circuit, and wherein an optical axis of each vertically integrated photodetector is substantially parallel to the normal to the plane of the photonic circuit.

2. The integrated assembly of claim 1, wherein the electrical output signal from one or more detector modules is transmitted to an electrical circuit of the MEMS/optoelectronic module.

3. The integrated assembly of claim 1, wherein the photonic circuit comprises a photonic crystal having one or more optical waveguides and one or more resonant grating couplers, and wherein an input resonant grating coupler is configured to be positioned directly beneath at least one emitter module.

4. The integrated assembly of claim 3, wherein at least one resonant grating coupler is an on-chip splitter.

5. The integrated assembly of claim 3, wherein at least one resonant grating coupler is optically connected to each of a first optical waveguide and a second optical waveguide and wherein each of the first optical waveguide and the second optical waveguide are configured to travel in opposite directions from the at least one resonant grating coupler.

6. The integrated assembly of claim 5, wherein a third optical waveguide is optically coupled to the MEMS/optoelectronic module.

7. The integrated assembly of claim 6, wherein the MEMS/optoelectronic module comprises a sensor structure configured to provide a sensing signal, and wherein the third optical waveguide is configured to carry information regarding the sensing signal.

8. The integrated assembly of claim 7, wherein the sensing signal is transmitted by an optical resonator, wherein the optical resonator is configured to provide an optical sensing signal carrying the information regarding the sensing signal, and wherein the optical resonator is optically connected to the third optical waveguide.

9. The integrated assembly of claim 8, wherein the third optical waveguide is optically connected to at least one detector module of the one or more detector modules.

10. The integrated assembly of claim 9, wherein the third optical waveguide is optically connected to an output resonant grating coupler, and wherein the output resonant grating coupler is configured to be positioned beneath at least one detector module.

11. The integrated assembly of claim 1, wherein the MEMS/optoelectronic module comprises a stack comprising one or more mesas configured to provide a fixed gap between the MEMS/optoelectronic module and at least one detector module of the one or more detector modules or at least one emitter module of the one or more emitter modules.

12. The integrated assembly of claim 1, wherein a front surface portion of each emitter module of the one or more emitter modules and a front surface portion of each detector module of the one or more detector modules are vertically aligned and bonded to a front surface portion of the MEMS/optoelectronic module.

13. The integrated assembly of claim 12, further comprising a fully integrated optical signal path from an emitter module of the one or more emitter modules to the MEMS/optoelectronic module and from the MEMS/optoelectronic module to each detector module of the one or more detector modules.

14. The integrated assembly of claim 1, wherein:
 the MEMS/optoelectronic module comprises a MEMS/photonic chip, one or more fixed gap structures disposed on a front surface portion of the MEMS/photonic chip, the photonic circuit disposed on the one or more fixed gap structures and a front surface portion of the MEMS/photonic chip, and one or more metal bond pads disposed in proximity to each fixed gap structure and on a front surface portion of the photonic circuit;
 each emitter module comprises a III-V emitter chip, one or more vertically emitting light sources disposed on a front surface portion of the III-V emitter chip, one or more posts beneath one or more fixed gap structures, and one or more metal bond pads in proximity to each post and on a front surface portion of the III-V emitter chip; and each detector module comprises a semiconductor detector chip, one or more vertically integrated photodetectors disposed on a front surface portion of the semiconductor detector chip, one or more posts beneath one or more fixed gap structures, and one or more metal bond pads in proximity to each post and on a front surface portion of the semiconductor detector chip.

15. A method of making an integrated assembly comprising:

providing a MEMS/optoelectronic module comprising a photonic circuit and an electrical circuit, wherein the photonic circuit comprises one or more input resonant grating couplers, one or more output resonant grating couplers, and at least one optical waveguide optically connecting one input resonant grating coupler to one output resonant grating coupler;

vertically aligning one or more emitter modules with at least one input resonant grating coupler each emitter module being displaced in a direction normal to a plane of the photonic circuit, and an optical axis of each emitter module being substantially parallel to the normal to the plane of the photonic circuit;

vertically aligning one or more detector modules with at least one output resonant grating coupler, each detector module being displaced in a direction normal to the plane of the photonic circuit, and an optical axis of each detector module being substantially parallel to the normal to the plane of the photonic circuit;

bonding each emitter module to the MEMS/optoelectronic module, thereby directly optically coupling the MEMS/optoelectronic module to each emitter module; and bonding each detector module to the MEMS/optoelectronic module, thereby directly optically coupling the MEMS/optoelectronic module to each detector module.

16. The method of claim 15, wherein the MEMS/optoelectronic module comprises a stack comprising one or more mesas configured to provide a fixed gap between the MEMS/optoelectronic module and at least one of a detector module of the one or more detector modules or an emitter module of the one or more emitter modules.

17. The method of claim 16, wherein each of the MEMS/optoelectronic module, one or more detector modules, and one or more emitter modules comprises one or more metal bond pads disposed on a front surface portion.

18. The method of claim 16, wherein the MEMS/photonic module comprises one or more metal bond pads each disposed in proximity to a respective one of the one or more mesas, and wherein each detector module and each emitter module comprises one or more posts configured to be positioned directly beneath a respective one of the one or more metal bond pads.

19. The method of claim 18 further comprising:

aligning each post of a detector module of the one or more detector modules with at least one respective mesa;

aligning each post of an emitter module of the one or more emitter modules with at least one respective mesa;

placing a first solder material between the detector module of the one or more detector modules and the MEMS/optoelectronic module; and placing a second solder material between the emitter module of the one or more emitter modules and the MEMS/optoelectronic module.

20. An integrated assembly comprising:

a MEMS/optoelectronic module comprising a photonic circuit, wherein the photonic circuit comprises one or more input resonant grating couplers, one or more output resonant grating couplers, and at least one optical waveguide optically connecting one of the one or more input resonant grating couplers to one of the one or more output resonant grating couplers;

an emitter module aligned with at least one of the one or more input resonant grating couplers, wherein the emitter module is bonded to the MEMS/optoelectronic module, wherein each emitter module is directly optically connected to a portion of the photonic circuit, wherein the emitter module is displaced in a direction normal to a plane of the photonic circuit, and wherein an optical axis of the emitter is substantially parallel to the normal to the plane of the photonic circuit; and a detector module aligned with at least one of the one or more output resonant grating couplers, wherein the detector module is bonded to the MEMS/optoelectronic module, wherein each detector module is directly optically connected to a portion of the photonic circuit, wherein the detector module is displaced in the direction normal to the plane of the photonic circuit, and wherein an optical axis of the detector module is substantially parallel to the normal to the plane of the photonic circuit.

* * * * *